United States Patent [19]
Solomon et al.

[11] Patent Number: 5,019,882
[45] Date of Patent: May 28, 1991

[54] GERMANIUM CHANNEL SILICON MOSFET

[75] Inventors: Paul M. Solomon, Yorktown Heights; Steven L. Wright, Peekskill, both of N.Y.

[73] Assignee: International Business Machines Corporation, Armonk, N.Y.

[21] Appl. No.: 351,630

[22] Filed: May 15, 1989

[51] Int. Cl.$^5$ .................. H01L 29/68; H01L 29/161; H01L 29/80; H01L 29/12
[52] U.S. Cl. .................... 357/23.8; 357/16; 357/22; 357/58
[58] Field of Search ................ 357/16, 22 D, 22 A, 357/58, 23.3, 22 B, 22 C, 23.8

[56] References Cited

U.S. PATENT DOCUMENTS

| | | | |
|---|---|---|---|
| 4,529,455 | 7/1985 | Bean et al. | 148/175 |
| 4,556,895 | 12/1985 | Ohata | 357/23.7 |
| 4,827,320 | 5/1989 | Morkoc et al. | 357/22 A |

OTHER PUBLICATIONS

"Growth and Properties of Si/SiGe Superlattices", B. Kasper, pp. 703-716, MSS-II Proceedings, Kyoto, Japan.
"Measurement of the Band Gap of $Ge_xSi_{1-x}$/Si Strained-Layer Heterostructures", Applied Physics Letters, 47, p. 1333 (1985), D. V. Lang et al.
"Two-Dimensional Electron Systems in $Si/Si_xGe_{1-x}$ Strained Layer Superlattices", by G. Abstreiter et al., MSS-II Proceedings, Kyoto, Japan, Sep. 1985, p. 717.

Primary Examiner—Andrew J. James
Assistant Examiner—Roy K. Potter
Attorney, Agent, or Firm—Thomas J. Kilgannon

[57] ABSTRACT

An alloy layer comprising germanium and silicon is grown on top of a silicon substrate. The alloy layer is kept thin enough for proper pseudomorphic, dislocation free growth. A layer of silicon is applied to the alloy layer. The initial silicon layer is from two to three times as thick as the alloy layer. Approximately the upper two-thirds of the silicon layer is oxidized, either thermally, anodically or by plasma anodization. The silicon layer that remains between the silicon dioxide and the alloy layer is kept thin enough so that a parasitic channel does not form on the interface between the silicon and the silicon dioxide. The germanium alloyed channel is thus suitably bounded by silicon crystalline structures on both of the channel layer surfaces. The barrier heights between silicon dioxide and silicon are very large thus providing good carrie confinement. A suitably applied voltage will result in a region of high mobility charge carriers at the interface between the alloy layer and the upper silicon layer.

15 Claims, 1 Drawing Sheet

GERMANIUM CHANNEL SILICON MOSFET

BACKGROUND OF THE INVENTION

1. Field of the Invention

This invention relates in general to semiconductor devices and in particular to a metal oxide field effect transistor having a channel including germanium for improved carrier mobility.

Field effect transistors are horizontal devices including a source, a drain spaced from the source and a gate disposed between the source and the drain. A channel region lies underneath the gate and between the source and the drain. A metal oxide field effect transistor has a metal electrode affixed to an oxide layer disposed on top of the channel. A voltage imposed upon the gate electrode controls the flow of current from the source to the drain within the channel. Such MOSFET devices are widely used and are easily fabricated due to a somewhat unique combination of silicon and its oxide silicon dioxide.

Silicon is a semiconductor material. Its conductivity can be altered by suitable doping. In contrast, silicon dioxide is an excellent insulator. The interface between silicon and silicon dioxide can be made with extremely high electrical quality, that is, with a very low density of electronic interface states within the energy bandgap of silicon. The silicon dioxide layer is best formed by oxidation of the underlying substrate. In addition, silicon dioxide has very litte reaction with many known processing agents including etchants. As such, silicon dioxide is also used as a mask during intermediate fabrication steps.

One of the disadvantages of silicon as a semiconductor is its electron mobility. The passage of electrons through silicon is limited by the crystal lattice structure of the silicon atom. Other materials, such as germanium, have energy band structures that permit higher carrier mobility. Such higher carrier mobility is desirable because the mobility of carriers ultimately determines the switching speed of the device. The faster the switching speed, the more operations the given device can perform within a given unit of time.

It has been shown that an alloy layer of germanium and silicon can be grown on a silicon substrate so long as the alloy layer is thin enough. Since the lattice spacing of a crystal of germanium is larger than the lattice of a crystal of silicon, a layer that includes an alloy of germanium and silicon is placed under strain. The germanium crystal lattice is compressed and provides a so-called pseudomorphic layer. See K. Casper, "Growth Improprieties of Si/SiGe Superlattices" MSS-II Proceedings, page 703, Kyoto, Japan, September 1975; D. V. Lang et al, "Measurement of the Band Gap of $Ge_xSi_{1-x}$/Si Strained Layer Heterostructures", Applied Physics Letters, 47, page 1333 (1985). With such strained layers, others have demonstrated that two-dimensional electron and hole gas layers can be formed in the silicon/alloy interface layers in such devices. It is reported that enhanced electron and hole mobilities have been obtained for such devices. See G. Abstreiter et al, "Two Dimensional Electron Gas Systems in Si/-$Ge_xSi_{1-x}$ Strained Layers Superlattices", MSS-II Proceedings, page 717, Kyoto, Japan, September 1985.

It is possible that the hole mobility in such a system is enhanced by the strain in the alloy layer which decreases the energy of the light hole band relative to the heavy hole band. In that system, the conduction and valence band discontinuities are relatively low. It is not precisely known how the bandgap discontinuity is shared between the conduction and valence band. However, it is suspected that small discontinuities, along with small Schottky barriers on the silicon, would make commercial utilization of such devices very difficult.

In customary MOSFET technology, the barrier height between the silicon and silicon dioxide is very large, which has the desirable effect of keeping gate leakage currents very small. This interface is between an amorphous insulator and a crystalline semiconductor so that it has the undesirable property of scattering electrons and holes strongly, reducing their mobility. It is, therefore, desirable to have a germanium alloy channel with a single crystal interface to silicon and somehow include the advantages of the germanium alloy channel with the operational and fabrication advantages of silicon and silicon dioxide.

In U.S. Pat. No. 4,556,895, there is shown a device with a germanium channel and either a silicon or a silicon dioxide layer deposited on the channel. Such a device provides only a single band gap between the germanium channel and the next layer. There is no disclosure that the oxide layer is thermally formed and thermal formation is unlikely due to the nature of the device. Thermal formation of oxide layers is a widely used technique.

In U.S. Pat. No. 4,529,455, a method is described for oxidizing a silicon layer deposited on an alloy layer of silicon and germanium. The entire silicon layer is oxidized so there is only a single energy band gap between the two layers. There is no residual silicon layer between the oxide layer and the alloy layer.

Neither of the foregoing patents describes a device or method that adapts a device with a germanium alloy layer to silicon/silicon dioxide systems, devices and processes.

SUMMARY OF THE INVENTION

The invention overcomes the disadvantages of the surface states of the prior art devices and retains the advantages of the silicon/silicon dioxide systems by applying a layer of silicon to the surface of an alloy layer and partially oxidizing the silicon layer. An alloy layer comprising germanium and silicon is grown on top of a silicon substrate. The alloy layer is kept thin enough for proper pseudomorphic, dislocation free growth. A layer of silicon is applied to the alloy layer. The initial silicon layer is from two to three times as thick as the alloy layer. Approximately the upper two-thirds of the silicon layer is oxidized, either thermally, anodically or by plasma anodization. The silicon layer that remains between the silicon dioxide and the alloy layer is kept thin enough so that a parasitic channel does not form on the interface between the silicon and the silicon dioxide. Such a system can then be processed by conventional means to form n-channel or p-channel MOSFET devices.

The germanium alloyed channel is thus suitably bounded by silicon crystalline structures on both of the channel layer surfaces. The barrier height between silicon dioxide and silicon is very large thus providing good carrier confinement. There is a further, smaller band discontinuity between the upper silicon layer and the alloy layer. A suitably applied voltage will result in a region of high mobility charge carriers at the interface between the alloy layer and the upper silicon layer. This region will contain a two-dimensional electron or hole gas. For a p-doped device, the region will provide a two-dimensional hole gas at the interface. In the two-dimensional hole gas, positive charge carriers will have very high mobility in the channel.

Since the MOSFET device of the invention includes upper layers of silicon and silicon dioxide, the remaining processing steps of the device are traditional. As such, the upper silicon dioxide layer can be used for masking purposes and then later for insulating purposes as part of an insulated gate electrode.

BRIEF DESCRIPTION OF THE DRAWINGS

The foregoing summary and features of the invention will become more apparent with reference to the following description of the preferred embodiment taken in conjunction with the accompanied drawings, wherein:

In FIG. 2, the conduction and valence band discontinuities are shown to be about equal. In the event, for instance, that the conduction band discontinuity is much smaller than the valence band discontinuity, then the advantages of this invention would pertain mainly to the p-channel device.

DETAILED DESCRIPTION OF THE INVENTION

Figure 1:
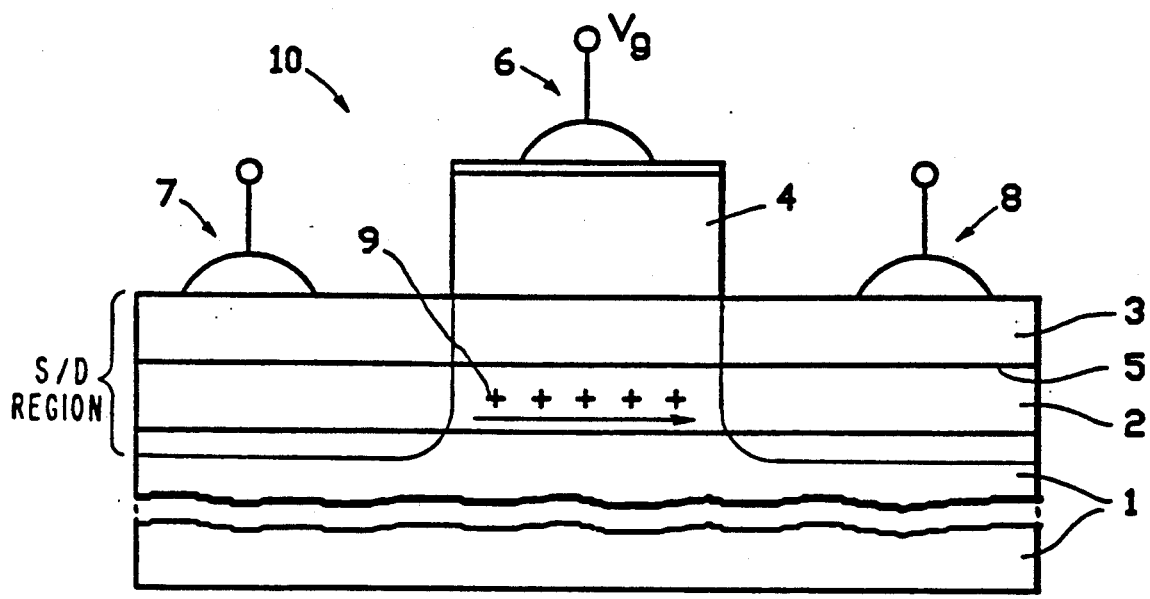
FIG. 1 is a sectional view of the preferred embodiment of the invention.

There is generally shown a MOSFET device 10 of the invention in FIG. 1. The transistor 10 includes a substrate 1 of silicon. An alloy layer 2 is pseudomorphically formed on top of silicon substrate 1. The alloy layer 2 comprises $Ge_xSi_{1-x}$ where "x" is the content of germanium. In general, the amount of germanium present in alloy layer 2 can be as high an amount as will not relieve strain in alloy layer 2. Thus, the percentage of germanium in alloy layer 2 may range between 1 and 99% and is preferably 50%.

A further layer of silicon having a thickness sufficient to provide a desired oxide thickness is epitaxially deposited upon the alloy layer 2. The upper portion of the silicon layer is oxidized to form a layer 4 of silicon dioxide. A portion of the silicon dioxide layer 4 is etched or otherwise removed in order to expose the residual silicon layer 3 for receiving source and drain contacts 7, 8. A gate 6 is applied to layer 4. A channel region 9 in alloy layer 2 lies underneath gate 6 and between the source and drain contacts 7,8.

The silicon layer 3 may be processed into either an n-channel or p-channel MOSFET. In the following description, it shall be assumed that the device is processed into a p-channel MOSFET. However, those skilled in the art will appreciate that n-channel doping is possible.

Layer 1, the Si buffer layer, may be of any convenient thickness, about 2000Å, for example.

Layer 2 is of suitable thickness sufficient to maintain a pseudomorphic monocrystalline structure. It may range in thickness from 20 to 300Å.

Layer 3 has to be very thin, depending on how much is oxidized, with the thickness after oxidation being about 20Å.

Layer 4 should be fairly thin, about 100Å in order to achieve a high transconductance FET.

An exemplary thickness for each layer in device 10 is 10 nm for alloy layer 2, 5 nm for upper silicon layer 3 and 10 nm for silicon dioxide layer 4. The latter is formed by partially oxidizing the top portion of an originally formed silicon layer. Oxidation may be accomplished either thermally or by plasma anodization. The remaining silicon layer 3 is kept thin enough so that no parasitic channels are formed at the interface between layers 3 and 4.

Figure 2:
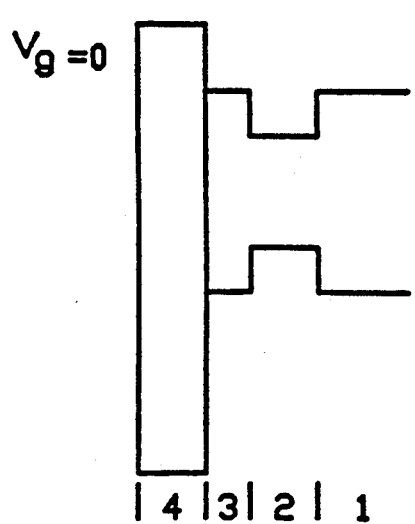
FIG. 2 is an energy band diagram of the invention with no gate voltage.

Turning now to FIG. 2, there is shown an energy band diagram of the device of FIG. 1 where there is no voltage applied to gate electrode 6. In this condition, there is a large barrier between the upper silicon dioxide layer 4 and the silicon layer 3. There is a further band discontinuity between the silicon layer 3 and the alloy layer 2. The band gap then returns to the same level as that of layer 3 since the substrate 1 is also silicon.

Figure 3:
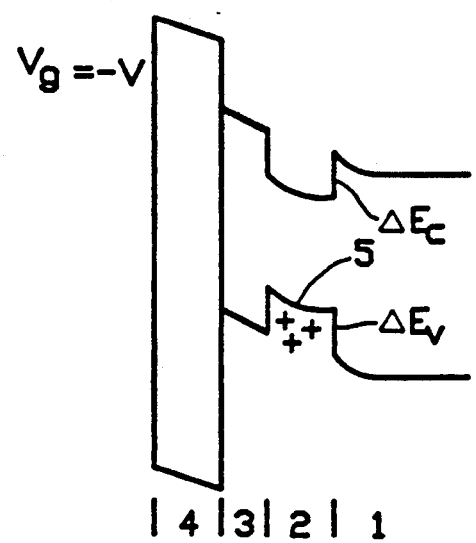
FIG. 3 is an energy band diagram of the invention with an energized gate.

When a negative voltage is applied to the gate 6, the band diagram is altered as shown in FIG. 3. Oxide layer 4 prevents current from leaking through gate electrode 6. Accordingly, the electric field established by the negative voltage on electrode 6 attracts a large number of positive carriers to interface 5 of alloy layer 2 and silicon layer 3. This concentration of positive carriers or holes assumes a two-dimensional configuration. At the strained interface of the two crystalline layers at interface 5, positive charge carriers at the interface have a high mobility and move in substantially a two-dimensional direction with interface 5, between the source and drain 7, 8.

More specifically, a two-dimensional hole gas forms at interface 5. Germanium has hole transport properties superior to silicon. The transport properties of the channel are improved by the structure 10 because the holes are confined to interface 5 rather than to the interface between layers 3 and 4. Hole transport properties are further improved because the alloy layer is strained causing the energy of the light hole band to be lowered. Substrate effects are reduced due to the heterojunction confinement by the interface formed between alloy layer 2 and substrate 1.

The interface between dioxide layer 4 and silicon layer 3 has a low interface state density because dioxide layer 4 is thermally grown on the silicon layer 3. Such type of growth is compatible with traditional silicon based processing techniques. Hence, the remaining portions of integrated circuit fabrication may be readily used to fabricate complementary integrated circuits, i.e., circuits including both n-doped and p-doped devices.

Having described the preferred embodiment of the invention, it is recognized that those skilled in the art will appreciate that further modifications, alterations, additions and deletions may be made thereto without departing from the spirit and scope of the invention as defined by the following claims.

Having thus described our invention, what we claim as new and desire to secure by Letters Patent is:

1. A field effect transistor of the type wherein current in a channel between ohmic contacts is influenced by a potential applied to a gate disposed over said channel the improvement comprising:
   a substrate of a first monocrystalline semiconductor material,
   a strained, pseudomorphic, epitaxial channel layer of an alloy of said first semiconductor material and a second semiconductor material disposed on said substrate, an epitaxial layer of an oxidizable semiconductor material disposed on said channel layer, and, a gate oxide layer of said oxidizable semiconductor disposed on said oxidizable semiconductor layer.

2. A field effect transistor according to claim 1 wherein said first monocrystalline semiconductor material is silicon.

3. A field effect transistor according to claim 1 wherein said second semiconductor material is germanium and said alloy is $Ge_xSi_{1-x}$.

4. A field effect transistor according to claim 1 wherein said oxidizable semiconductor material is silicon.

5. A field effect transistor according to claim 1 wherein said gate oxide layer is silicon dioxide.

6. A field effect transistor according to claim 1 wherein the content of said second semiconductor material in said alloy is sufficient to introduce strain in said channel layer.

7. A field effect transistor according to claim 1 wherein the content of said second semiconductor material in said alloy lies in a range of 1% to 99%.

8. A field effect transistor according to claim 1 wherein the content of said second semiconductor material in said alloy is 50%.

9. In a field effect transistor of the type wherein current in a channel between two ohmic contacts is influenced by a potential applied to a gate in proximity to said channel, the improvement comprising:

a channel containing strained, pseudomorphic, epitaxial layer of a $Ge_xSi_{1-x}$ alloy disposed on a monocrystalline silicon substrate, an epitaxial layer of silicon disposed over $Ge_xSi_{1-x}$ layer, and a layer of silicon dioxide in contact with said layer of silicon.

10. The invention of claim 1 wherein the Ge content of said channel containing layer is as high as possible to maintain said channel containing layer in the strained condition.

11. The invention of claim 9 wherein said silicon dioxide layer is about twice the thickness of either the channel containing layer or the silicon layer.

12. The invention of claim 9 wherein said channel containing layer and said silicon layer are about 10 nm and 2 nm thick, respectively.

13. The invention of claim 9 wherein said silicon dioxide layer is 10 nm thick.

14. The invention of claim 9 wherein the amount of Ge in said channel containing layer lies in a range between 1% to 99%.

15. The invention of claim 10 wherein the Ge content of said channel containing layer is 50%.

* * * * *